June 4, 1957
H. O. BERG
CATHODE FOLLOWER RADIO FREQUENCY AMPLIFIER FOR RADIO RECEIVER
Filed Jan. 12, 1952
2,794,909
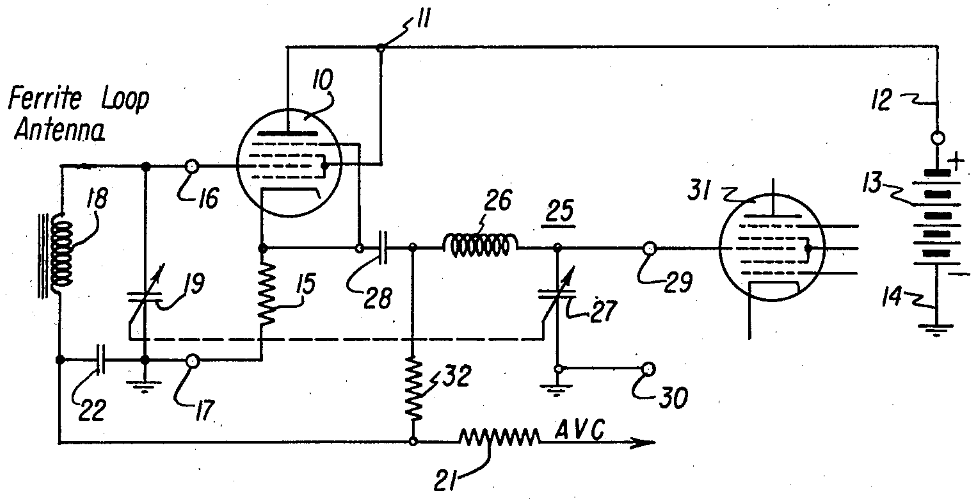
INVENTOR.
Howard O. Berg
BY
Foorman L. Mueller
Atty.

United States Patent Office 2,794,909

Patented June 4, 1957

2,794,909

CATHODE FOLLOWER RADIO FREQUENCY AMPLIFIER FOR RADIO RECEIVER

Howard O. Berg, Chicago, Ill., assignor to Motorola, Inc., Chicago, Ill., a corporation of Illinois Application January 12, 1952, Serial No. 266,156

2 Claims. (Cl. 250—20)

The present invention relates to radio frequency amplifier circuits, and more particularly to such amplifier circuits which are specially adapted to be used in the so-called midget type of radio receiver.

Continued development of midget radio receiver design has for one of its important objectives the reduction in size and simplification of the various circuit components together with the expected economic advantages of lower costs for the circuit components. A recent development has led to the use of a self-contained tuned loop antenna of the iron core type. The gain versus frequency characteristic of such a tuned loop antenna requires, for most effective use thereof, that the tuned radio frequency amplification stages associated therewith have substantially uniform gain over the entire tunable frequency range of the loop.

In order to enable the use of physically smaller circuit elements and components, such as smaller variable tuning condensers and simplified smaller coil structures, in a radio frequency amplifier tunable through the broadcast frequency range, it has been proposed to use series resonant tuning circuits including a single winding solenoid coil and a variable tuning condenser connected in series. Automatic volume control circuits have been found to be essential in commercially acceptable modern radio receiver design. Previous circuit arrangements that attempted to use a series resonant tuned circuit and provide for the application of an automatic volume control bias to the control grid of the succeeding amplifier tube have not been entirely successful. This is because an automatic volume control bias circuit by-passing condenser must also be connected in parallel with the series resonant circuit at the point of connection of the automatic volume control bias voltage thereto. Such a by-pass condenser was required to have close tolerance to avoid undesirable varying capacity effects on the variable tuning condenser. For example, a low capacity value for the by-pass condenser in such circuit would give good gain but would pad the tuned circuit causing variations and mistracking over the frequency range of the tuned circuit. A high capacity value for the by-pass condenser would minimize mistracking but the circuit gain would be lower than practicable. Fixed condensers having close tolerances as regards temperature variations and so forth and suitable for such by-pass use are relatively expensive and therefore are not desirable in midget radio design.

It is an important object of this invention to provide an improved tuned radio frequency amplifier having substantially uniform gain over the entire tunable frequency range.

Another object of the invention is to provide a tuned radio frequency amplifier using simplified circuit elements of smaller physical size.

Still another object of the invention is to provide an improved tuned radio frequency amplifier using a series resonant tuned circuit in an arrangement enabling the connection of an automatic volume control bias circuit and not requiring the use of components having critical values and close tolerances.

A feature of the invention is the provision of a cathode follower type radio frequency tuned circuit in which a series resonant tuned circuit including a single winding solenoid coil and a series connected variable tuning condenser is connected through a coupling condenser in parallel with the cathode bias resistance of the cathode follower tube circuit in a manner to provide substantially uniform gain over the tunable frequency range of the series resonant circuit. In such arrangement, the gain of the circuit is the product of the injected signal voltage developed across the cathode bias resistance times the Q of the series resonant circuit.

Another feature of the invention is the provision of a series resonant tuned coupling circuit connected by a coupling condenser to the cathode electrode of a preceding cathode follower connected electron tube, and to the control grid electrode of a succeeding grid controlled electron tube, and having an automatic volume control bias circuit connected through the coil of the series tuned circuit to the control grid of the succeeding tube in a manner not requiring additional by-pass capacity for the automatic volume control circuit at such point of connection.

Further objects, features and the attending advantages of the present invention will be apparent with reference to the following specification and drawing in which the sole figure is a schematic diagram of a preferred embodiment of the circuit of the invention.

A first grid controlled electron tube 10, and a second grid controlled eelctron tube 31 are shown, the tube 10 being connected as a cathode follower tuned radio frequency amplifier. The tube 31 may be connected as a mixer tube in a superheterodyne circuit, as an additional stage of tuned radio frequency amplification, or in a detector circuit, as desired, and since the circuit connections for the tube 31 are not pertinent to the present invention, the connections to the specific electrodes of the tube 31 have no been specifically shown and described except with reference to the control grid electrode.

The tube 10 is connected in a cathode follower circuit with its screen and plate electrodes connected together to point 11 and to the positive terminal 12 of the direct current source 13, whose negative terminal 14 is connected to chassis ground. The suppressor grid electrode and the cathode electrode of tube 10 are connected to chassis ground and the negative terminal 14 of the direct current source 13 through the cathode bias resistance 15. Input terminals 16 and 17 for a radio frequency signal are connected to the control grid of the tube 10 and chassis ground respectively. Connected across the input terminals 16 and 17 is the tunable input circuit including the iron core loop antenna coil 18 and the variable tuning condenser 19.

Automatic volume control bias voltage is applied through the resistor 21 and the coil of the loop antenna 18 to the control grid of the amplifier tube 10. A conventional bypass condenser 22 is connected as shown to return the radio frequency signals in the antenna coil 18 to chassis ground and isolates such signals from the automatic volume control circuit as is well known. The source of the automatic volume control bias voltage for resistor 21 is not shown and it should be understood that any well known circuit for obtaining automatic volume control bias voltage may be used.

A series resonant tuned circuit generally shown at 25 and comprising the single winding solenoid coil 26 and the variable tuning condenser 27 is connected in a series circuit with the coupling condenser 28 to the cathode electrode of tube 10 and chassis ground respectively. Output terminals 29 and 30 for the amplified radio frequency signals may be connected across the variable tuning condenser 27 and are adapted to be connected to the control grid circuit of the succeeding grid controlled electron tube 31 as shown.

In order to provide an automatic volume control bias voltage for the control grid of tube 31, the resistor 32 is connected as shown and the automatic volume control bias voltage from resistor 21 passes through resistor 32 and the solenoid coil 26 to the control grid of tube 31.

Now in considering the operation of the circuit of the invention it should first be pointed out that the variable tuning condenser 27 and the variable tuning condenser 19 may be ganged together for single dial tuning as is conventional. However, the maximum capacity required for the variable tuning condenser 27 is considerably less than the maximum capacity required for a conventional variable tuning condenser as used in conventional plate amplication circuits. Such advantage is obtained because of the fact that the tube 10 is connected as a cathode follower and there is therefore no plate capacity to be reflected across the tuned circuit. It is desired to also point out that the coil 26 of the series tuned circuit 25 is the simplest form of single winding solenoid coil having no additional windings such as primary windings or the like.

When using an iron core loop antenna such as shown at 18 and assuming the grid controlled electron tube 31 to be connected as a mixer tube in a superheterodyne circuit, the cathode follower connected tuned radio frequency stage of the invention will have adequate gain which is substantially uniform over the entire tuning range and will have excellent selectivity and image rejection. As previously stated, the gain of the cathode follower tuned radio frequency circuit of the invention is a product of the injection voltage appearing across the cathode bias resistance 15 times the Q of the circuit including the resistor 15, coil 26 and variable tuning condenser 27. The tube 10 may be the type designated 12BD6 and the coil 26 may be selected to have an inductance of about 271 microhenries while the variable tuning condenser 27 may be selected to have a maximum capacity of 226.2 micro-microfarads and a minimum capacity of 9 micro-microfarads. The 12BD6 tube connected as shown, has a mutual conductance of approximately 2350 micromhos. The cathode bias resistance may be selected to have a value of approximately 47 ohms. In the embodiment of the invention with the circuit values given above and at a frequency of 600 kilocycles the inductive reactance of the coil 26 may be 1400 ohms and the Q of the coil may be 50. The resistance of the coil 26 may be approximately 30 ohms and therefore the total circuit resistance at such frequency is equal to the cathode resistance 15 plus the coil resistance or 77 ohms so that the Q of such circuit is 18 at a frequency of 600 kilocycles. At a frequency of 1400 kilocycles the inductive reactance of the same coil 26 is approximately 3500 ohms and the coil Q is 35 while the coil resistance is approximately 100 ohms. The total circuit resistance is therefore 147 ohms and the circuit Q is about 23.5.

As previously stated the gain of the cathode follower circuit of the invention is equal to the injection voltage appearing across the cathode resistance 15 times the circuit Q. When using the 12BD6 tube connected as shown and having a mutual conductance of 2350 micromhos, the injected voltage appearing across the cathode resistance 15 is approximately one eleventh of the input voltage so that for a frequency of 600 kilocycles at which the circuit Q is approximately 18 the gain of the circuit is theoretically 1.6. At the frequency of 1400 kilocycles, at which the circuit Q is approximately 23.5, the theoretical gain of the circuit is approximately 2.1. It is therefore seen that the gain is substantially uniform over the frequency range of 600 to 1400 kilocycles, which is approximately the entire range of the broadcast frequency band. In a practical application of the above circuit, using the values given above, voltage measurements have shown that the gain is actually about 2.1 at 600 kilocycles and 2.3 at 1400 kilcoycles. Although such gain is not considered to be high it is nevertheless fully adequate when used with an iron core antenna loop coil and is particularly advantageous in that the gain is substantially uniform over the entire tunable frequency range. It has also been found that the circuit is exceedingly stable and provides excellent selectivity and image rejection and does not require the use of critical component values. In this connection the coupling condenser 28 need not have close tolerance and may have a value of .01 microfarad which is a very common value and readily obtainable.

Although the cathode follower connected tube 10 has been shown with its suppressor grid electrode connected to the cathode electrode, the suppressor grid electrode may be grounded or may be connected to the plate electrode which changes the effective mutual conductance of the tube, however, to somewhat reduce the circuit gain. The preferred arrangement, therefore, is to connect the suppressor grid to the cathode as previously described. It should be understood that the invention is not to be limited to the specific values for the circuit components as described above, such values having been given solely for the purpose of illustrating the operation of the invention. Various modifications may be made within the spirit of the invention and the scope of the appended claims.

I claim:

1. A tuned radio frequency amplifier and coupling circuit including in combination, a first electron tube having at least control grid, plate, and cathode electrodes, a second electron tube of the controlled grid type, a source of direct current having positive and negative terminals, a pair of radio frequency signal input terminals connected to the control grid electrode of said first tube and said negative terminal respectively, means connecting the plate electrode of said first tube to said positive terminal, a cathode bias resistor connected between the cathode electrode of said first tube and said negative terminal, a series resonant tuned circuit including coil and variable condenser elements, means connecting said series resonant circuit in series between the cathode electrode of said first tube and the negative terminal of said source respectively, said means connecting said series resonant tuned circuit including a coupling condenser connected between the coil end of said resonant circuit and the cathode electrode of said first tube, means connecting an automatic volume control bias circuit to the connection between said coil and coupling condenser, and a pair of amplified radio frequency signal output terminals connected across the variable condenser of said tuned circuit and to the control grid of said second tube and said negative terminal respectively.

2. A tuned radio frequency amplifier and coupling circuit including in combination a first electron tube having at least control grid, plate and cathode electrodes, a second electron tube of the grid controlled type, a first tuned circuit comprising a loop antenna coil and variable condenser connected to the grid electrode of said first tube, a source of direct current having positive and negative terminals, means connecting said positive terminal to the plate electrode of said first tube, a cathode bias resistor connected between the cathode electrode of said first tube and said negative terminal, a second series resonant tuned circuit including coil and variable condenser elements, means connecting said second tuned circuit in series between the cathode electrode of said first tube and said negative terminal, said means connecting said series resonant tuned circuit including a coupling condenser connected between the coil end of said resonant circuit and the cathode electrode of said first tube, means connecting an automatic volume control bias circuit to the connection between said coil and coupling condenser, and a pair of output terminals connected across the variable condenser of said series resonant circuit and to the control grid electrode of said second tube and said negative terminal respectively.

References Cited in the file of this patent

UNITED STATES PATENTS

| | | |
|---|---|---|
| 2,240,715 | Percival | May 6, 1941 |
| 2,310,455 | Muller | Feb. 9, 1943 |
| 2,332,919 | Kleen | Oct. 26, 1943 |
| 2,549,761 | Adams | Apr. 24, 1951 |
| 2,589,736 | Sands | Mar. 18, 1952 |
| 2,662,938 | Goldstine | Dec. 15, 1953 |